United States Patent
Huang et al.

(10) Patent No.: US 11,688,787 B2
(45) Date of Patent: Jun. 27, 2023

(54) SEMICONDUCTOR DEVICE HAVING MODIFIED PROFILE METAL GATE

(71) Applicant: Taiwan Semiconductor Manufacturing Company, Ltd., Hsin-Chu (TW)

(72) Inventors: Yu-Lien Huang, Hsinchu County (TW); Chi-Wen Liu, Hsinchu (TW); Clement Hsingjen Wann, Carmel, NY (US); Ming-Huan Tsai, Hsinchu County (TW); Zhao-Cheng Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 124 days.

(21) Appl. No.: 17/301,467

(22) Filed: Apr. 5, 2021

(65) Prior Publication Data

US 2021/0226029 A1    Jul. 22, 2021

Related U.S. Application Data

(60) Continuation of application No. 16/572,438, filed on Sep. 16, 2019, now Pat. No. 10,971,594, which is a continuation of application No. 15/614,274, filed on Jun. 5, 2017, now Pat. No. 10,418,456, which is a continuation of application No. 14/952,733, filed on Nov. 25, 2015, now Pat. No. 9,673,292, which is a division of application No. 13/745,205, filed on Jan. 18, 2013, now Pat. No. 9,202,691.

(51) Int. Cl.
*H01L 29/49* (2006.01)
*H01L 29/66* (2006.01)
*H01L 21/02* (2006.01)
*H01L 29/78* (2006.01)
*H01L 29/423* (2006.01)
*H01L 29/51* (2006.01)

(52) U.S. Cl.
CPC .... *H01L 29/4966* (2013.01); *H01L 21/02697* (2013.01); *H01L 29/42368* (2013.01); *H01L 29/42376* (2013.01); *H01L 29/4958* (2013.01); *H01L 29/66545* (2013.01); *H01L 29/78* (2013.01); *H01L 29/517* (2013.01); *H01L 29/7833* (2013.01)

(58) Field of Classification Search
CPC ..................... H01L 29/42376; H01L 21/28114
See application file for complete search history.

(56) References Cited

U.S. PATENT DOCUMENTS

| | | | |
|---|---|---|---|
| 7,517,746 | B2 | 4/2009 | Lin et al. |
| 8,497,212 | B2 | 7/2013 | Babich et al. |
| 8,536,656 | B2 | 9/2013 | Ramachandran et al. |
| 8,735,235 | B2 | 5/2014 | Chuang |
| 8,835,294 | B2 | 9/2014 | Chew |

(Continued)

*Primary Examiner* — Farun Lu
(74) *Attorney, Agent, or Firm* — Haynes and Boone, LLP

(57) ABSTRACT

A semiconductor device has a semiconductor substrate with a dielectric layer disposed thereon. A trench is defined in the dielectric layer. A metal gate structure is disposed in the trench. The metal gate structure includes a first layer and a second layer disposed on the first layer. The first layer extends to a first height in the trench and the second layer extends to a second height in the trench; the second height is less than the first height.

20 Claims, 14 Drawing Sheets

(56) References Cited

U.S. PATENT DOCUMENTS

| | | |
|---|---|---|
| 8,951,855 B2 | 2/2015 | Lai |
| 9,524,934 B2 | 12/2016 | Chern et al. |
| 2004/0142546 A1 | 7/2004 | Kudo et al. |
| 2008/0185637 A1* | 8/2008 | Nagaoka ............ H01L 29/42368 |
| | | 257/E21.409 |
| 2011/0241130 A1* | 10/2011 | Chan ................... H01L 29/4958 |
| | | 438/653 |
| 2013/0099307 A1 | 4/2013 | Tseng et al. |
| 2013/0280900 A1* | 10/2013 | Lai .................... H01L 29/66545 |
| | | 438/589 |

* cited by examiner

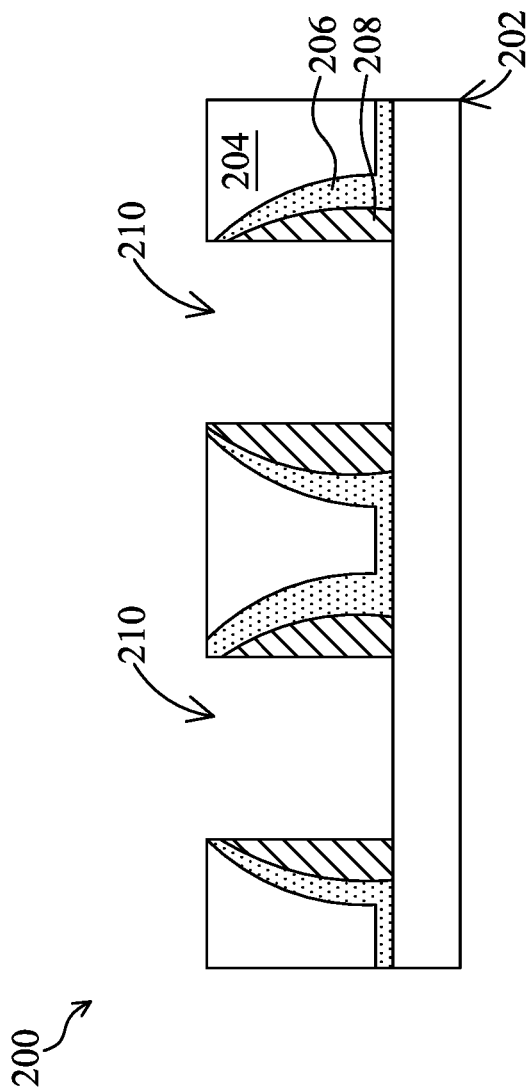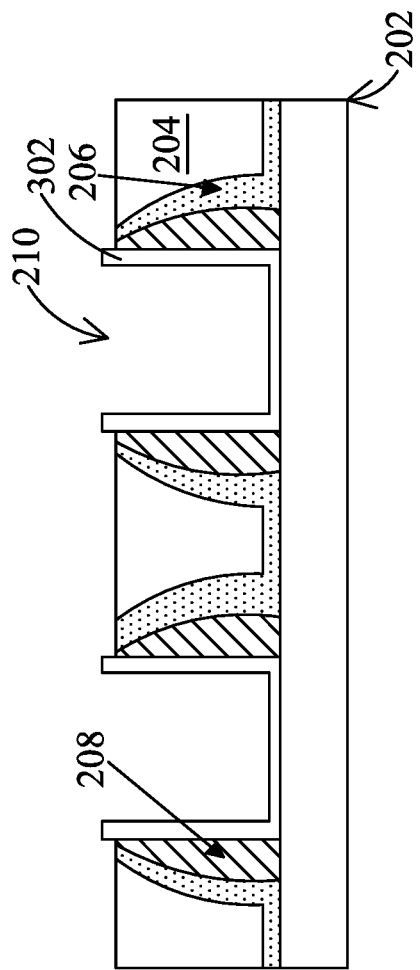

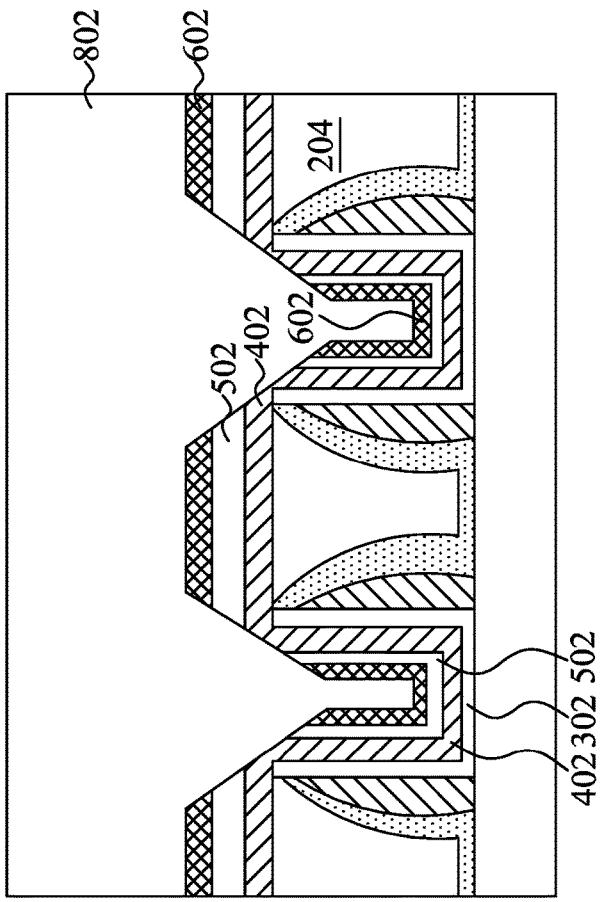
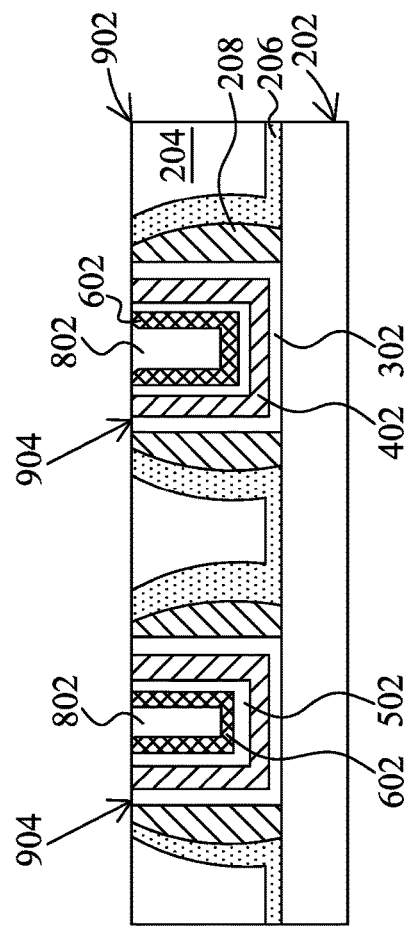
Fig. 8
Fig. 9

SEMICONDUCTOR DEVICE HAVING MODIFIED PROFILE METAL GATE

PRIORITY DATA

The present application is a Continuation Application of Ser. No. 16/572,438 filed Sep. 16, 2019, issuing as U.S. Pat. No. 10,971,594, which is a continuation of U.S. Ser. No. 15/614,274 filed Jun. 5, 2017, now U.S. Pat. No. 10,418,456, which is a Continuation Application of U.S. Ser. No. 14/952,733 filed Nov. 25, 2015, now U.S. Pat. No. 9,673,292, which is a Divisional Application of U.S. Ser. No. 13/745,205, filed Jan. 18, 2013, entitled "SEMICONDUCTOR DEVICE HAVING MODIFIED PROFILE METAL GATE," now U.S. Pat. No. 9,202,691, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement gate or "gate last" process in which the final gate stack is fabricated "last," which allows for reduced number of subsequent processes, including high temperature processing that must be performed after formation of the gate. Such a process uses a dummy gate stack, which is subsequently removed and replaced with a metal gate stack. There are challenges to implementing such features and processes in the scaled down processes however. For example, filing the trench provided by the removal of a dummy gate stack encounters an aspect ratio that is challenging to fill without inducing voiding.

Thus, while the present gate-last processes of forming a metal gate are suitable in many respects, there may be a desire to improve the methods and/or devices to reduce the gap-filling issues for example.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-9 are cross-sectional views of an exemplary semiconductor device fabricated according to one or more steps of the method 100.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
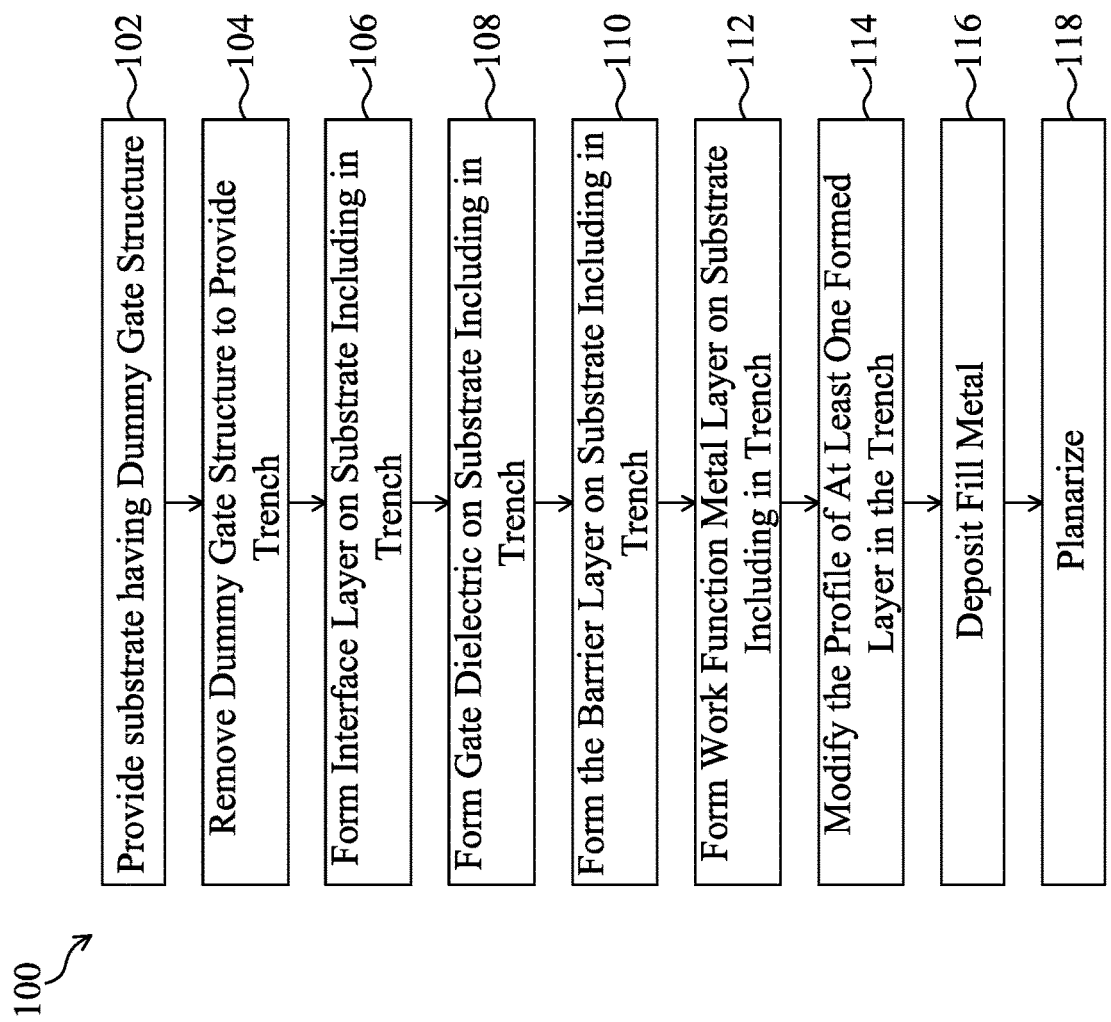
FIG. 1 is a method of fabricating a semiconductor device according to one embodiment of the present disclosure including a profile modification process.
Figure 4:
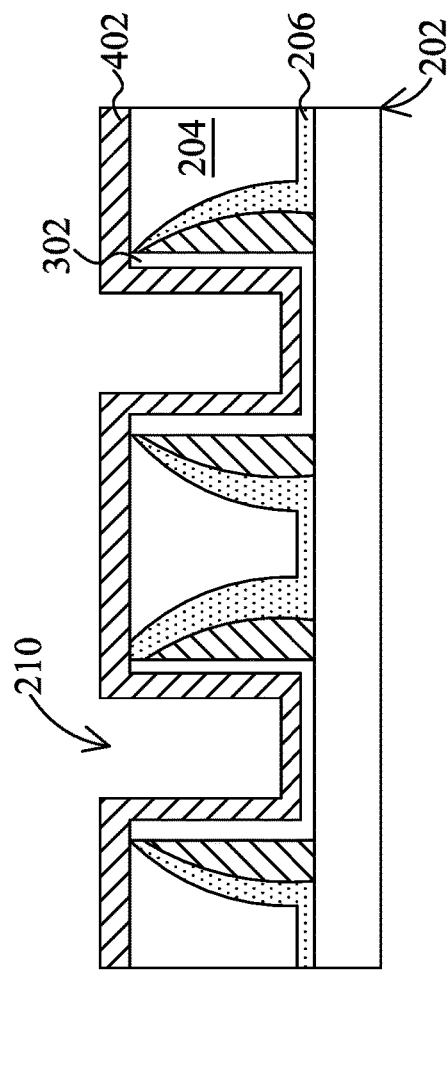
Figure 5:
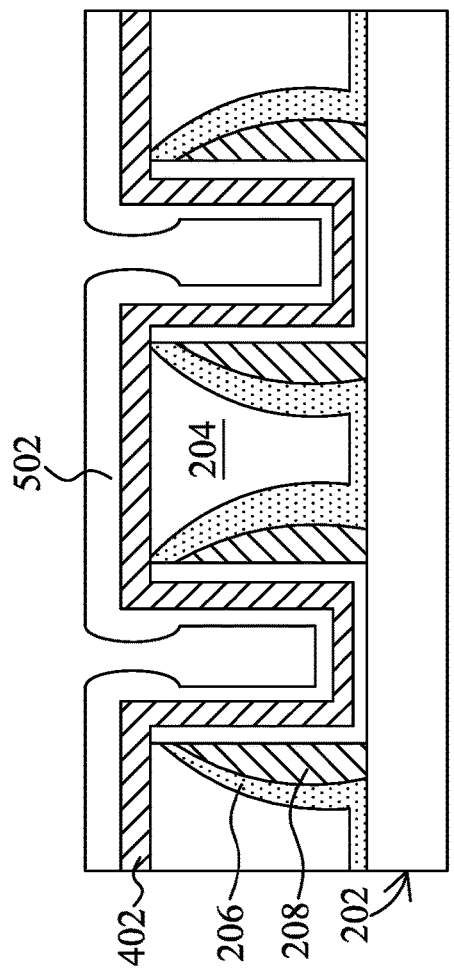

Illustrated in FIG. 1 is a method 100 of fabricating a semiconductor device using a replacement gate (also referred to as gate-last) methodology that includes modifying the profile or shape of at least one layer that forms a gate structure. The modifying of the profile of at least one layer of the gate structure may also be referred to as re-shaping the gate structure. The modification of the profile or re-shaping provides an opening for the trench, within which the gate structure is formed, that may allow for improved gap filling of the trench. This may provide a benefit, for example, reduction of voiding that may form in the replacement gate structure due to filling difficulties with a high aspect ratio trench. FIGS. 2-9 are cross-sectional views of an embodiment of a semiconductor device fabricated according to one or more of the steps of the method 100.

It is understood that the method 100 includes steps having features of a complementary metal-oxide-semiconductor (CMOS) technology process flow and thus, are only described briefly herein. Additional steps may be performed before, after, and/or during the method 100. Similarly, one may recognize other portions of a device that may benefit from the methods described herein. It is also understood that parts of the semiconductor devices of FIGS. 2-9 may be fabricated by complementary metal-oxide-semiconductor (CMOS) technology process flow, and thus some processes are only briefly described herein. Further, these devices may include various other devices and features, such as additional transistors, bipolar junction transistors, resistors, capacitors, diodes, fuses, etc., but is simplified for a better understanding of the inventive concepts of the present disclosure. These devices may also include a plurality of semiconductor devices (e.g., transistors), which may be interconnected. The devices may be intermediate devices fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 begins at block 102 where a substrate having a dummy gate structure disposed thereon is provided. The substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the substrate is a semiconductor on insulator (SOI) substrate.

The dummy gate structure includes at least one sacrificial layer. The dummy gate structure may include an interface layer (IL), a gate dielectric layer, a dummy gate electrode layer, and/or other suitable layers. In an embodiment, the IL may include a dielectric material such as silicon oxide layer ($SiO_2$) or silicon oxynitride (SiON). The IL may be formed by chemical oxidation, thermal oxidation, atomic layer deposition (ALD), CVD, and/or other suitable dielectric. In an embodiment, the gate dielectric layer includes an oxide such as $SiO_2$. In other embodiments, the gate dielectric layer may include a low-k dielectric as hafnium oxide ($HfO_2$), $TiO_2$, HfZrO, $Ta_2O_3$, $HfSiO_4$, $ZrO_2$, $ZrSiO_2$, combinations thereof, or other suitable material. The dielectric layer may be formed by thermal oxidation, atomic layer deposition (ALD) and/or other suitable methods. In an embodiment, the dummy gate electrode layer includes polysilicon and/or other suitable material. The dummy gate electrode layer may be formed by CVD, PVD, ALD, other suitable methods, and/or combinations thereof.

The dummy gate structure can be formed by a procedure including depositing, photolithography patterning, and etching processes to form the stack. As discussed above, a plurality of layers may be formed or deposited. These layers may then been patterned to form a gate stack. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching).

In embodiments, spacer elements may be formed abutting the sidewalls of the dummy gate structure prior to or after the formation of the source/drain regions (or portions thereof). The spacer elements may be formed by depositing a dielectric material followed by an isotropic etching process, however other embodiments are possible. In an embodiment, the spacer elements include silicon oxide, silicon nitride, and/or other suitable dielectrics. The spacer elements may include a plurality of layers.

The method 100 may also include forming additional features. In one embodiment, source/drain regions are formed. The source/drain regions may include the introduction of suitable dopant types: n-type or p-type dopants. The source/drain regions may include halo or low-dose drain (LDD) implantation, source/drain implantation, source/drain activation and/or other suitable processes. In other embodiments, the source/drain regions may include raised source/drain regions, strained regions, epitaxially grown regions, and/or other suitable techniques.

In an embodiment, a contact etch stop layer (CESL) and an interlayer dielectric (ILD) layer are formed on and around the dummy gate structure(s). Examples of materials that may be used to form CESL include silicon nitride, silicon oxide, silicon oxynitride, and/or other materials known in the art. The CESL may be formed by PECVD process and/or other suitable deposition or oxidation processes. The ILD layer may include materials such as, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may also be deposited by a PECVD process or other suitable deposition technique.

The method 100 then continues to block 104 where the dummy gate structure is removed to provide a trench or opening. The removal of the dummy gate structure may include a planarization process used to expose a top surface of the dummy gate structure. The planarization process may include a chemical mechanical planarization (CMP) process. Upon exposure, the dummy gate structure may be removed in whole in or part by suitable wet and/or dry etching processes. In one embodiment, the gate dielectric is removed. In another embodiment, the gate dielectric is kept and provided in the final gate structure.

Referring to the example of FIG. 2, illustrated is a device 200 having a substrate 202, an ILD layer 204, a CESL 206, spacer elements 208, and a trench 210. The trench 210 is provided by the removal of a dummy gate structure (not shown).

The method 100 then continues to block 106 where an interface layer (IL) is formed in the trench. The interface layer may be a gate dielectric layer such as $SiO_2$, $Al_2O_3$, and/or other suitable material. The interface layer may be provided by thermal oxidation, chemical oxidation, and/or other suitable process. Referring to the example of FIG. 3, an interface layer (IL) 302 is disposed in the trench 210.

The method 100 then proceeds to block 108 where a dielectric layer is formed in the trench. The dielectric layer (and/or the IL) may provide the gate dielectric for the semiconductor device. In one embodiment, the dielectric layer includes a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The dielectric layer may be formed by ALD and/or other suitable methods. Referring to the example of FIG. 4, a dielectric layer 402 is formed on the substrate. The dielectric layer 402 may be a high-k dielectric layer.

The method 100 then proceeds to block 110 where a barrier layer is formed on the substrate including in the trench. The barrier layer may include TaN, however other compositions may also be suitable. In one embodiment, the barrier layer is a composite layer. Referring to the example of FIG. 5, a barrier layer 502 is disposed on the substrate 202 including in the trench 210. In an embodiment, block 110 is omitted.

The method 100 then proceeds to block 112 where a work function metal layer is formed on the substrate including in the trench. A work function metal layer included in the gate structure may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers (e.g., be a composite layer). The work function layer(s) may be deposited by CVD, PVD, ALD, and/or other suitable processes.

Figure 6:
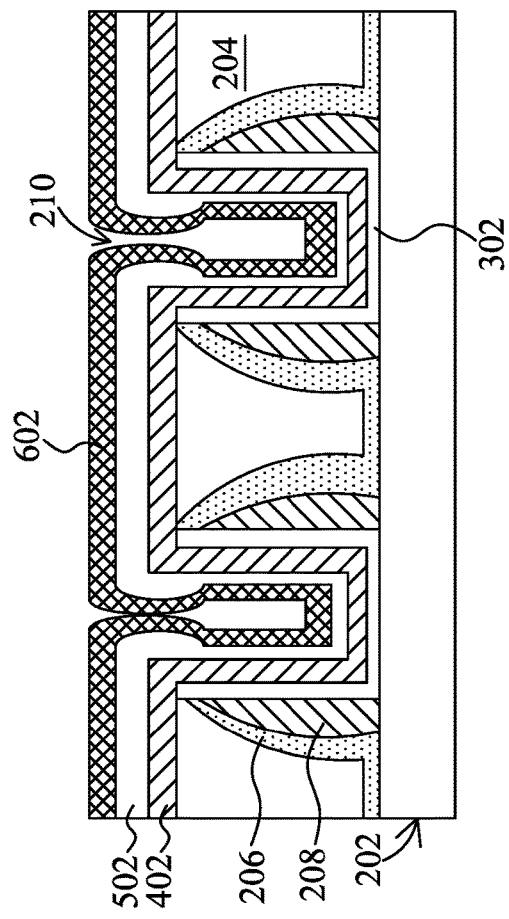

Referring to the example of FIG. 6, a work function metal layer 602 is disposed on the substrate 202 including in the trench 210. The work function metal layer 602 is illustrated as a contiguous layer between the two trenches illustrated on the substrate 210; however, other embodiments are possible. For example, different work function metal layer(s) may be formed depending on the type of device associated with the gate to be formed in the trench.

In an embodiment, additional layers may be formed in the trench before or after those discussed above. In one embodiment, an additional barrier layer is formed after the work function layer(s).

The method 100 then proceeds to block 114 where a profile modification process (e.g., re-shaping) is performed on at least one of the deposited layers described above with reference to block 106, 108, 110, and/or 112. The profile modification process may remove portions of the layers such that a modified entry profile is provided for the trench. The profile modification process may include a wet etch and/or dry etch process. The profile modification process may be performed in a single etching step. In another embodiment, the modification includes a plurality of steps. In an embodiment, block 114 occurs after the formation of the work function metal layer(s). However, block 114 may alternatively or additionally occur after any of the deposition steps described above with reference to blocks 106, 108, and 110, for example, prior to the formation of the next layer in the trench. In one embodiment, the modification/re-shaping occurs after the dielectric (e.g., HK dielectric) deposition (e.g., prior to the barrier layer). In one embodiment, the modification/re-shaping occurs after the barrier layer formation (e.g., prior to the work function layer). In one embodiment, the modification/re-shaping occurs after the work function layer formation.

Figure 7:
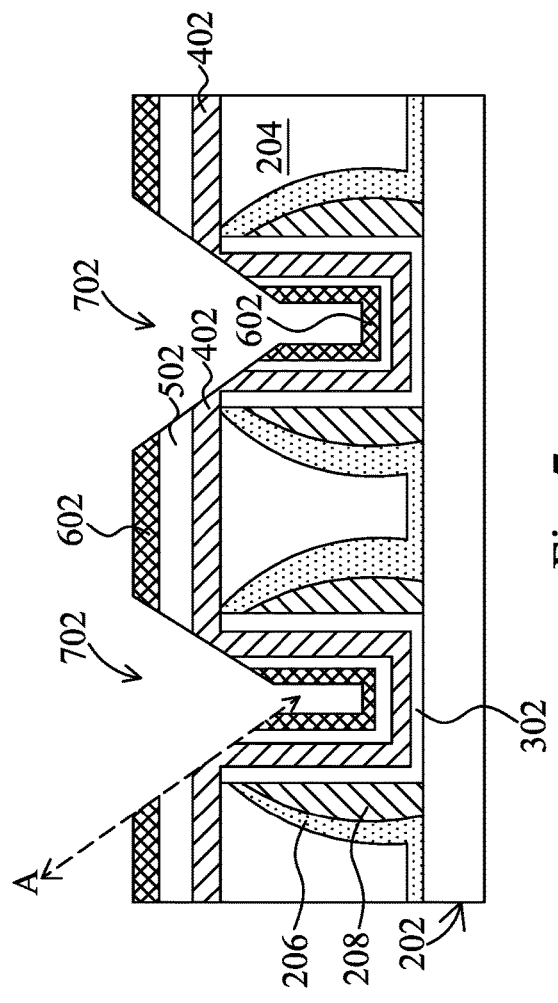

Referring to the example of FIG. 7, a modified profile opening 702 is illustrated. The modified profile 702 opening is substantially V-shaped. However, other shapes are possible including those described herein.

As illustrated in FIG. 7, the height of at least the layer 602 and 502 do not extend to the top of the trench 210 after the modification. In other embodiments, one or more of each of 302, 402, 502, and 602 may not extend to the top of the trench 210.

As discussed above, the profile modification process may include an etching process or processes. In an embodiment, the etching process is a dry etch such as, a plasma etch process. Exemplary processes include, but are not limited to, inductively coupled plasma (ICP), transformer coupled plasma (TCP), electron cyclotron resonance (ECR), reactive ion etch (RIE), and/or other suitable processes. In one embodiment, the reaction gas used in the etching may include $BCl_3$, $Cl_2$, HBr, $O_2$, and/or other suitable etchants. In an embodiment, the profile modification process may include a wet etch process in addition to or in lieu of the dry etch process. The wet etch process may include an etchant such as, for example, $NH_4OH$, APM (a ammonium hydroxide-hydrogen peroxide mixture), HPM (a hydrochloric acid-hydrogen peroxide-water mixture), and/or other suitable etchants.

The method 100 then proceeds to block 116 where a fill metal is formed in the trench and on the profile modified layers. A fill layer may include Co—Al, Al, W, or Cu and/or other suitable materials. The fill metal may be formed by CVD, PVD, plating, and/or other suitable processes. Referring to the example of FIG. 8, fill metal 802 is disposed on the substrate 202.

The method 100 then proceeds to block 118 where a planarization process is performed. The planarization process may include a CMP process. Referring to the example of FIG. 9, a planarization process has formed a surface 902.

The planarization forms a gate structure in the trench. The gate structure is a metal gate structure (e.g., including a metal work function layer or metal gate electrode). The gate structure may include an interface layer, a gate dielectric layer(s), a barrier layer(s), a work function layer(s), fill layer(s), and/or other suitable layers. Referring to the example of FIG. 9, a metal gate structure 904 is illustrated. The metal gate structure 904 includes the IL 302, the dielectric 402, the buffer layer 502, the work function metal layer 602, and the fill layer 802.

Embodiments of the method 100 may provide benefits such as improved gap filling of the fill metal, described above with reference to block 116. For example, in embodiments, the modified profile opening (such as a substantial V-shape) allows for the fill metal to fill the remainder of the trench with the reduction of voiding.

Figure 10:
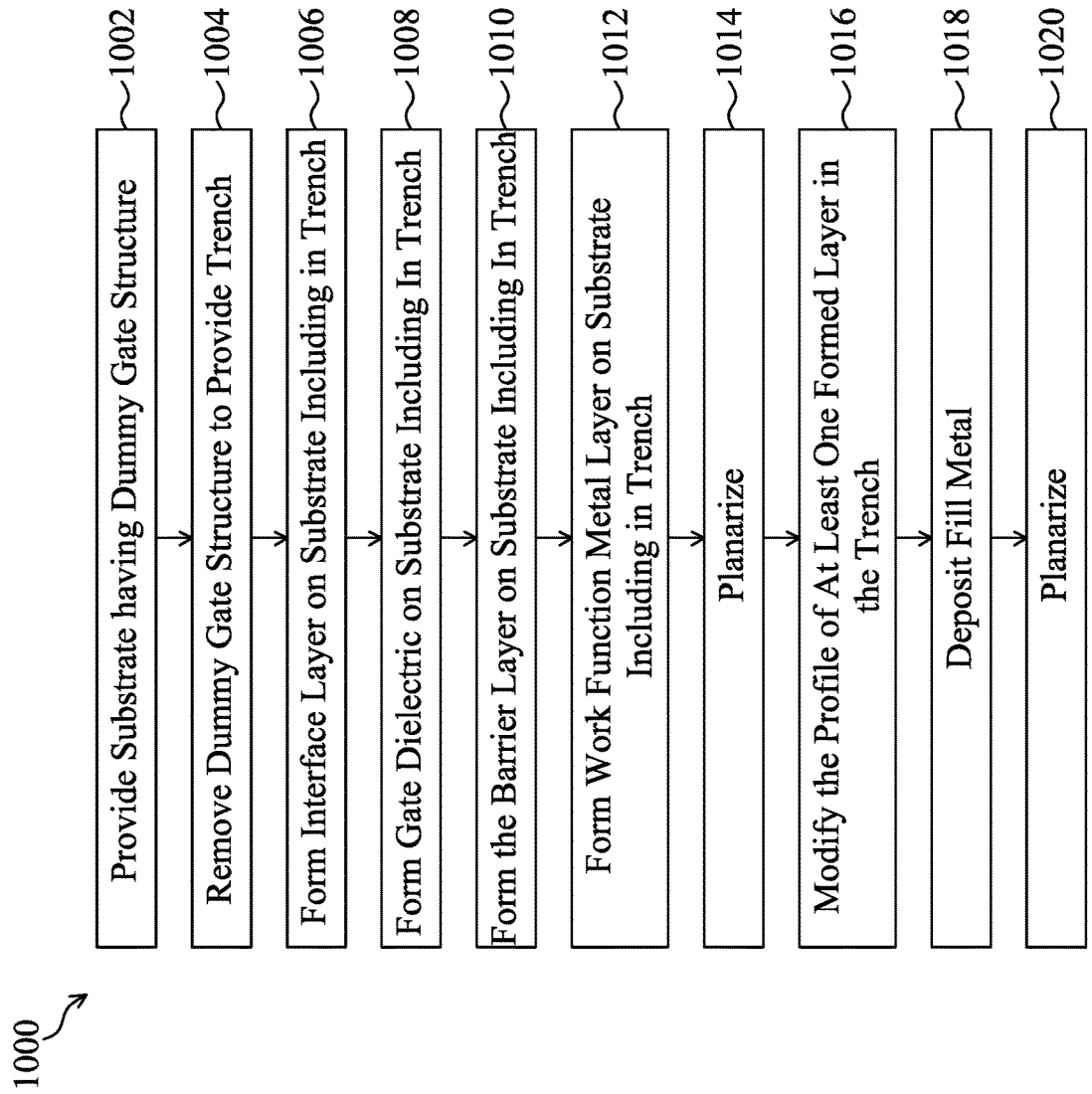
FIG. 10 is a method of fabricating a semiconductor device according to another embodiment of the present disclosure including a profile modification process.
Figure 11:
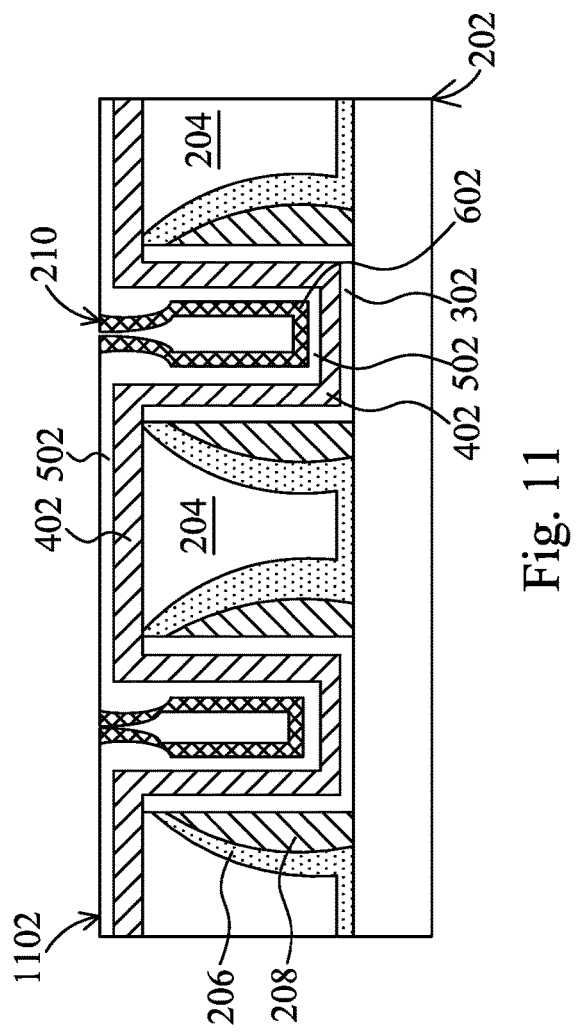
FIGS. 11-14 are cross-sectional views of an exemplary semiconductor device fabricated according to one or more steps of the method 100.

Illustrated in FIG. 10 is a method 1000 of fabricating a semiconductor device using a replacement gate (also referred to as gate-last) methodology that includes modifying the profile of at least one layer of a gate structure. The modifying of the profile of at least one layer of the gate structure may also be referred to as re-shaping the gate structure. The modification of the profile or re-shaping provides an opening of the trench within which the gate structure is formed that in embodiments allows for improved gap filling of the trench. This may provide a benefit, for example, of avoiding voiding that may form in the replacement gate structure due to filling difficulties of a high aspect ratio trench. FIGS. 2-6 and 11-14 are cross-sectional views of an embodiment of a semiconductor device fabricated according to one or more of the steps of the method 1000.

It is understood that the method 1000 includes steps having features of a complementary metal-oxide-semiconductor (CMOS) technology process flow and thus, are only described briefly herein. Additional steps may be performed before, after, and/or during the method 1000. Similarly, one may recognize other portions of a device that may benefit from the methods described herein. It is also understood that parts of the semiconductor devices of FIGS. 2-6 and 11-14 may be fabricated by complementary metal-oxide-semiconductor (CMOS) technology process flow, and thus some processes are only briefly described herein. Further, these devices may include various other devices and features, such as additional transistors, bipolar junction transistors, resistors, capacitors, diodes, fuses, etc., but is simplified for a better understanding of the inventive concepts of the present disclosure. These devices may also include a plurality of semiconductor devices (e.g., transistors), which may be interconnected. The devices may be intermediate devices fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 1000 begins at block 1002 where a substrate having a dummy gate structure disposed thereon is provided. Block 102 may be substantially similar to as described above with reference to the method 100 of FIG. 1.

The method 1000 then, after subsequent processing typical of a replacement gate process, continues to block 1004 where the dummy gate structure is removed to provide a trench or opening. Block 1004 may be substantially similar to block 104 of the method 100, described above with reference to FIG. 1. FIG. 2 is illustrative of the substrate 202, the ILD layer 204, the CESL 206, spacer elements 208, and the trench 210, as described above.

The method 1000 then continues to block 1006 where an interface layer is formed in the trench. The interface layer may be substantially similar to as described above with reference to block 106 of the method 100 of FIG. 1. Similarly, FIG. 3 and the illustration of the interface layer 302 is exemplary.

The method 1000 then proceeds to block 1008 where a dielectric layer is formed in the trench on the substrate. The dielectric layer (and/or the IL) may provide the gate dielectric for the semiconductor device. Block 1008 may be substantially similar to block 108 of the method 100, described above with reference to FIG. 1. Similarly, FIG. 4 and the illustration of dielectric layer 402 is exemplary.

The method 1000 then proceeds to block 1010 where a barrier layer is formed on the substrate including in the trench. Block 1010 may be substantially similar to block 110 of the method 100, described above with reference to FIG. 1. Similarly, FIG. 5 and the illustration of barrier layer 502 is exemplary.

The method 1000 then proceeds to block 1012 where a work function metal layer is formed on the substrate including in the trench. Block 1012 may be substantially similar to block 112 of the method 100, described above with reference to FIG. 1. Similarly, FIG. 6 and the illustration of the work function metal layer 602 is exemplary. In an embodiment of the method 1000, additional layers may be formed in the trench before or after those discussed above. For example, in one embodiment, an additional barrier layer is formed after the work function layer(s).

The method 1000 then proceeds to block 1014 where a planarization process is performed. The planarization process may include a CMP process. The CMP process may be a metal CMP, for example, removing an exposed metal layer and stopping at an underlying non-metal layer. In one embodiment, the planarization process removes portions of the work function layer. Referring to the example of FIG. 11, a planarization process has been performed resulting in surface 1102. The surface 1102 illustrates the removal of the work function layer 602 from the surface of the ILD layer. The surface 1102 may include the barrier layer 502. In an embodiment, the surface 102 includes the dielectric layer 402.

The method 1000 then proceeds to block 1016 where a profile modification process (e.g., re-shaping) is performed on at least one of the deposited layers described above with reference to block 1006, 1008, 1010, and/or 1012. The profile modification process may remove portions of the layers such that a modified entry profile opening is provided for the trench. The profile modification process may include a wet etch and/or dry etch process. The profile modification process may be performed in a single etching step. In another embodiment, the modification includes a plurality of steps. In an embodiment, block 1016 occurs after the formation of the work function metal layer(s). However, block 1016 may alternatively or additionally occur after any of the deposition steps described above with reference to blocks 1006, 1008, and 1010, for example, prior to the formation of the next layer in the trench. In one embodiment, the modification/re-shaping occurs after the dielectric (e.g., HK dielectric) deposition (e.g., prior to the barrier layer). In one embodiment, the modification/re-shaping occurs after the barrier layer formation (e.g., prior to the work function layer). In one embodiment, the modification/re-shaping occurs after the work function layer formation.

Figure 12:
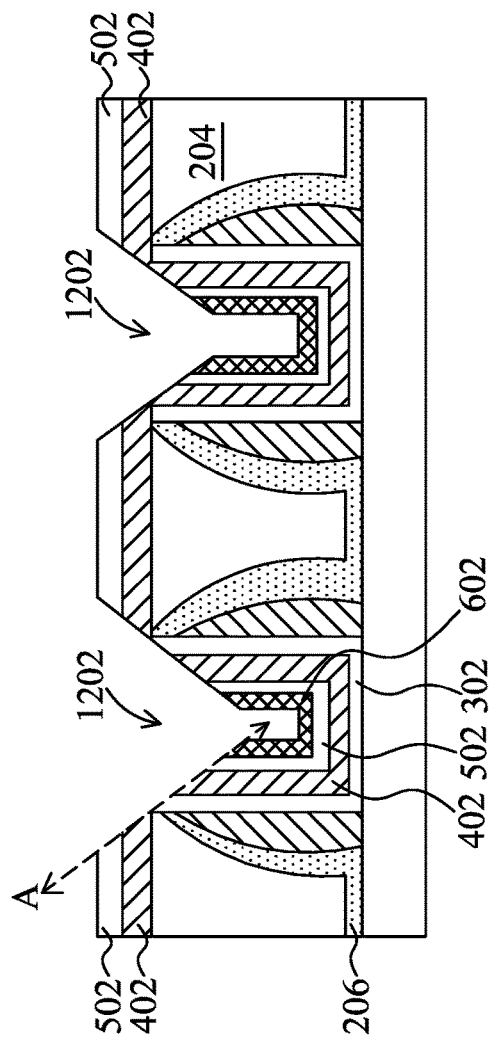
Figure 13:
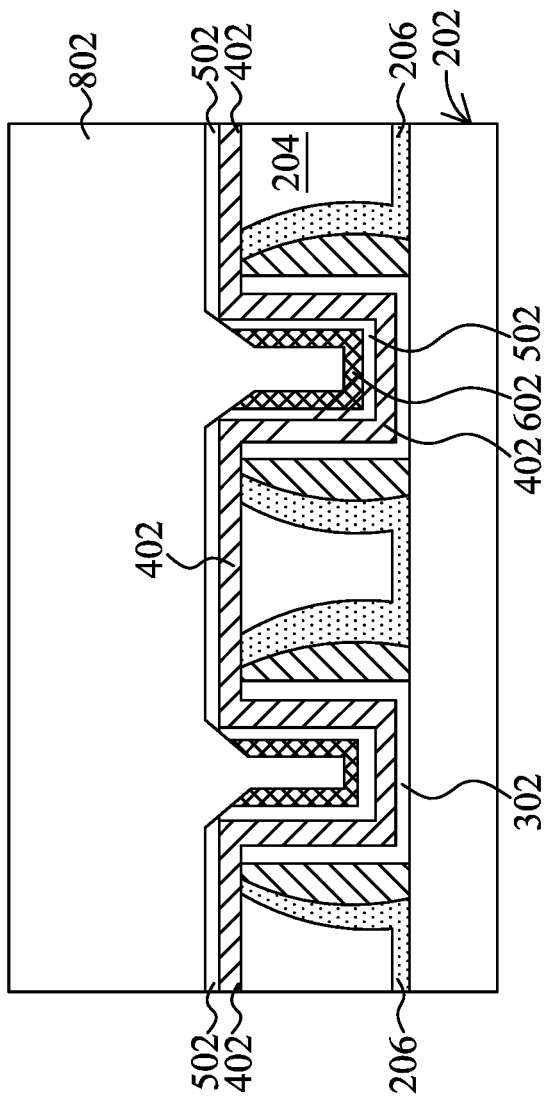
Figure 14:
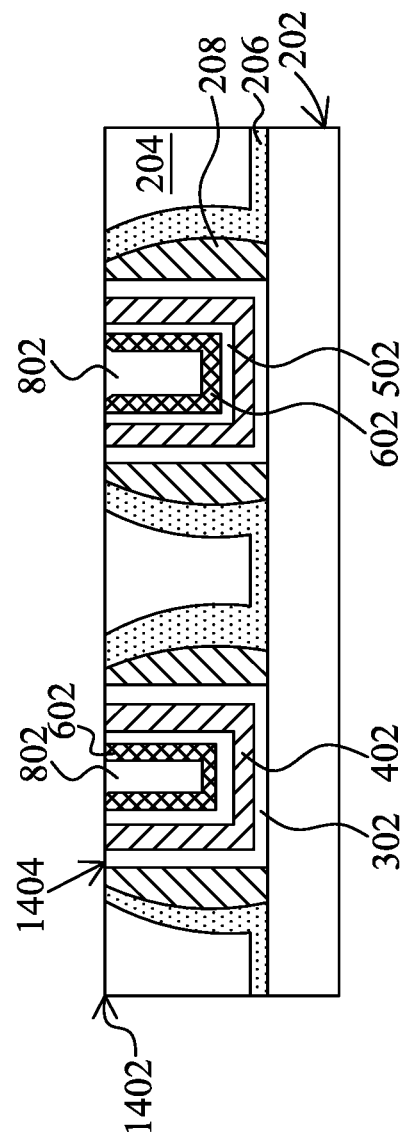

Referring to the example of FIG. 12, a modified profile opening 1202 is illustrated. The modified profile 1202 is substantially V-shaped. However, other shapes are possible including those described herein.

The height of at least one of the layers 402, 602 and 502 does not extend to the top of the trench 210 after the modification. In other embodiments, one or more of each of 302, 402, 502, and 602 may not extend to the top of the trench 210.

As discussed above, the profile modification process may include an etching process or processes. In an embodiment, the etching process is a dry etch such as, plasma etch processing. Exemplary processes include, but are not limited to, inductively coupled plasma (ICP), transformer coupled plasma (TCP), electron cyclotron resonance (ECR), reactive ion etch (RIE), and/or other suitable processes. In one embodiment, the reaction gas used in the etching may include $BCl_3$, $Cl_2$, HBr, $O_2$, and/or other suitable etchants. In an embodiment, the profile modification process may include a wet etch process in addition to or in lieu of the dry etch process. The wet etch process may include an etchant such as, for example, $NH_4OH$, APM (a ammonium hydroxide-hydrogen peroxide mixture), HPM (a hydrochloric acid-hydrogen peroxide-water mixture), and/or other suitable etchants.

The method 1000 then proceeds to block 1018 where a fill metal is formed in the trench and on the profile modified layers. A fill layer may include Co—Al, Al, W, or Cu and/or other suitable materials. The fill metal may be formed by CVD, PVD, plating, and/or other suitable processes. Referring to the example of FIG. 13, fill metal 802 is disposed on the substrate 202.

The method 1000 then proceeds to block 1020 where a planarization process is performed. The planarization process may include a CMP process. Referring to the example of FIG. 14, a planarization process has formed a surface 1402.

The planarization also forms a gate structure in the trench. The gate structure is a metal gate structure (e.g., including a metal work function layer or metal gate electrode). The gate structure may include an interface layer, a gate dielectric layer(s), a barrier layer(s), a work function layer(s), fill layer(s), and/or other suitable layers. Referring to the example of FIG. 14, a metal gate structure 1404 is illustrated. The metal gate structure 1404 includes the interface layer 302, the dielectric layer 402, the barrier layer 502, and the work function layer 602. However, other embodiments including additional and/or fewer layers may be possible.

Embodiments of the method 1000 may provide benefits such as improved gap filling of the fill metal, described above with reference to block 1018. For example, in embodiments, the modified profile opening (such as a substantial V-shape) allows for the fill metal to fill the remainder of the trench without or with the reduction of voiding.

It is noted that the methods described above illustrated a replacement gate or gate-last process that replaced the IL and gate dielectric layer as well as the overlying dummy gate electrode. However, in other embodiments, the originally formed gate dielectric layer may remain in the final device. For example, the profile modification or re-shaping may be performed on a gate dielectric layer formed underlying a sacrificial gate electrode (after the gate electrode's removal).

The embodiments described above in FIGS. 7 and 12 illustrate a substantially V-shaped modification or opening where each layer of the gate structure is etched to provide a substantially co-linear edge (see reference line A). However, other embodiments are possible including, but not limited to those depicted below in FIGS. 15-20.

The devices of FIGS. 15-20 may be formed using the method 100 of FIG. 1 and/or the method 1000 of FIG. 10.

Figure 15:
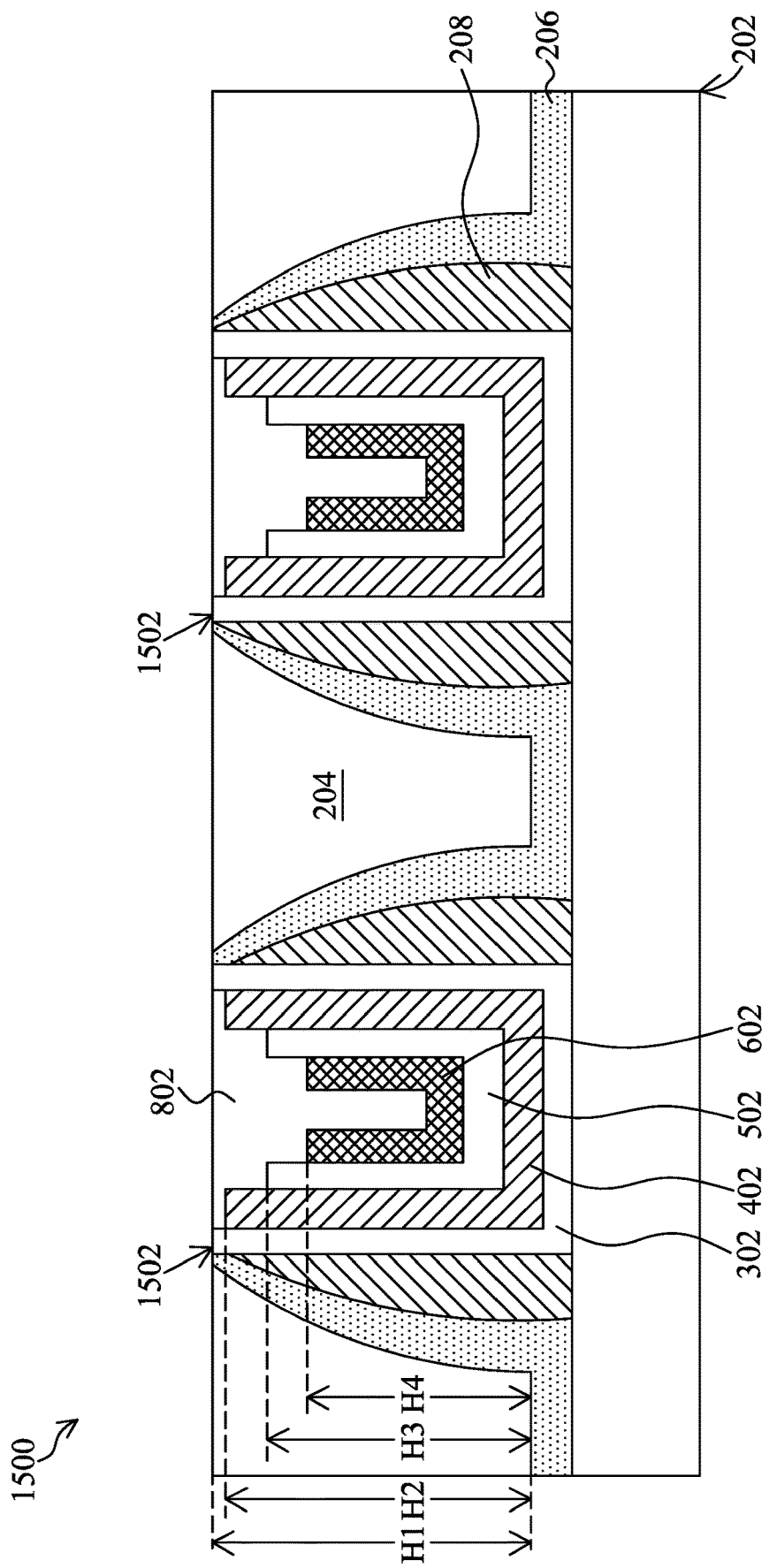
FIGS. 15-20 are cross-sectional views of exemplary semiconductor devices having modified profile gate structures.

FIG. 15 illustrates a device 1500 having a gate structure 1502. The gate structure 1502 includes an IL 302, a dielectric layer 402, a barrier layer 502, a work function metal layer 602 and a fill metal layer 802. It is noted that other layers may also be included such as, for example, capping layers, additional barrier layers, and the like. Similarly, one or more layers may be omitted. One or more of the IL 302, the dielectric layer 402, the barrier layer 502, the work function metal layer 602 and the fill metal layer 802 may include a plurality of layers. The height of the gate structure 1502 is H1. H1 may be depth of the trench formed by the removal of the dummy gate structure. The height of the dielectric layer 402 is H2. The height of the barrier layer 502 is H3. The height of the work function metal layer 602 is H3. In the embodiment of the device 1500, H1>H2>H3>H4.

The differing heights of the layers of the gate structure 1502 may be provided by a single etching step (e.g., wet etch, dry etch, plasma etch, and/or other suitable etching process). For example, the differing etch rate of the materials based on the selectivity of the chosen etching process may provide for differing heights of the layers. In other embodiments, a plurality of etching steps may be performed. The differing heights of the layers of the gate structure 1502 may be provided by the profile modification process substantially similar to as discussed above with reference to block 114 of FIG. 1 and/or block 1016 of FIG. 10.

Figure 16:
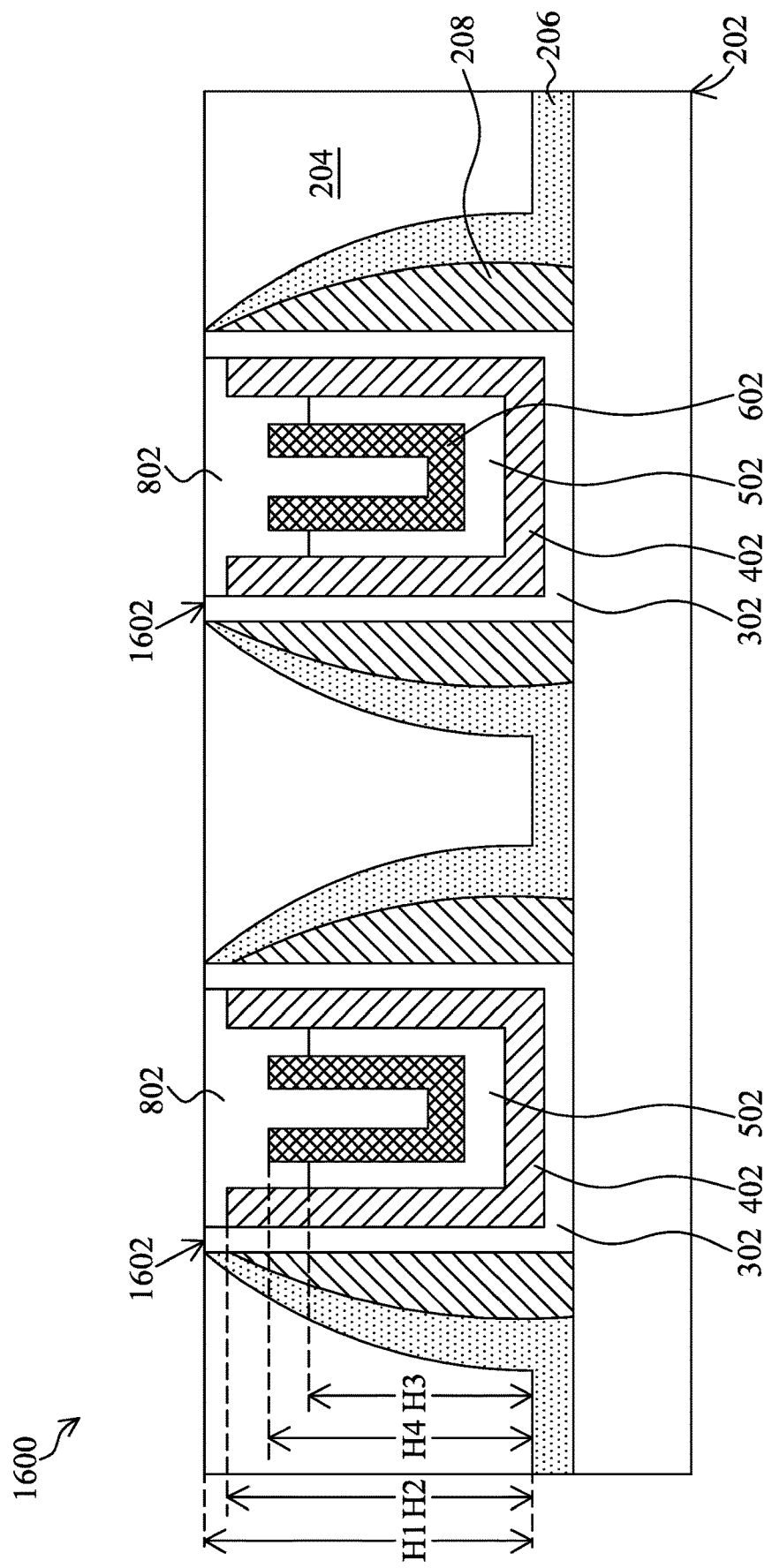

FIG. 16 illustrates a device 1600 having a gate structure 1602. The gate structure 1602 includes an IL 302, a dielectric layer 402, a barrier layer 502, a work function metal layer 602 and a fill metal layer 802. It is noted that other layers may also be included such as, for example, capping layers, additional barrier layers, and the like. Similarly, one or more layers may be omitted. One or more of the IL 302, the dielectric layer 402, the barrier layer 502, the work function metal layer 602 and the fill metal layer 802 may include a plurality of layers. The height of the gate structure 1602 is H1. H1 may be depth of the trench formed by the removal of the dummy gate structure. The height of the dielectric layer 402 is H2. The height of the barrier layer 502 is H3. The height of the work function metal layer 602 is H3. In the embodiment of the device 1600, H1>H2>H4>H3.

The differing heights of the layers of the gate structure 1602 may be provided by a single etching step (e.g., wet etch, dry etch, plasma etch, and/or other suitable etching process). For example, the differing etch rate of the materials based on the selectivity of the chosen etching process may provide for differing heights of the layers. In other embodiments, a plurality of etching steps may be performed. The differing heights of the layers of the gate structure 1602 may be provided by the profile modification process substantially similar to as discussed above with reference to block 114 of FIG. 1 and/or block 1016 of FIG. 10.

Figure 17:
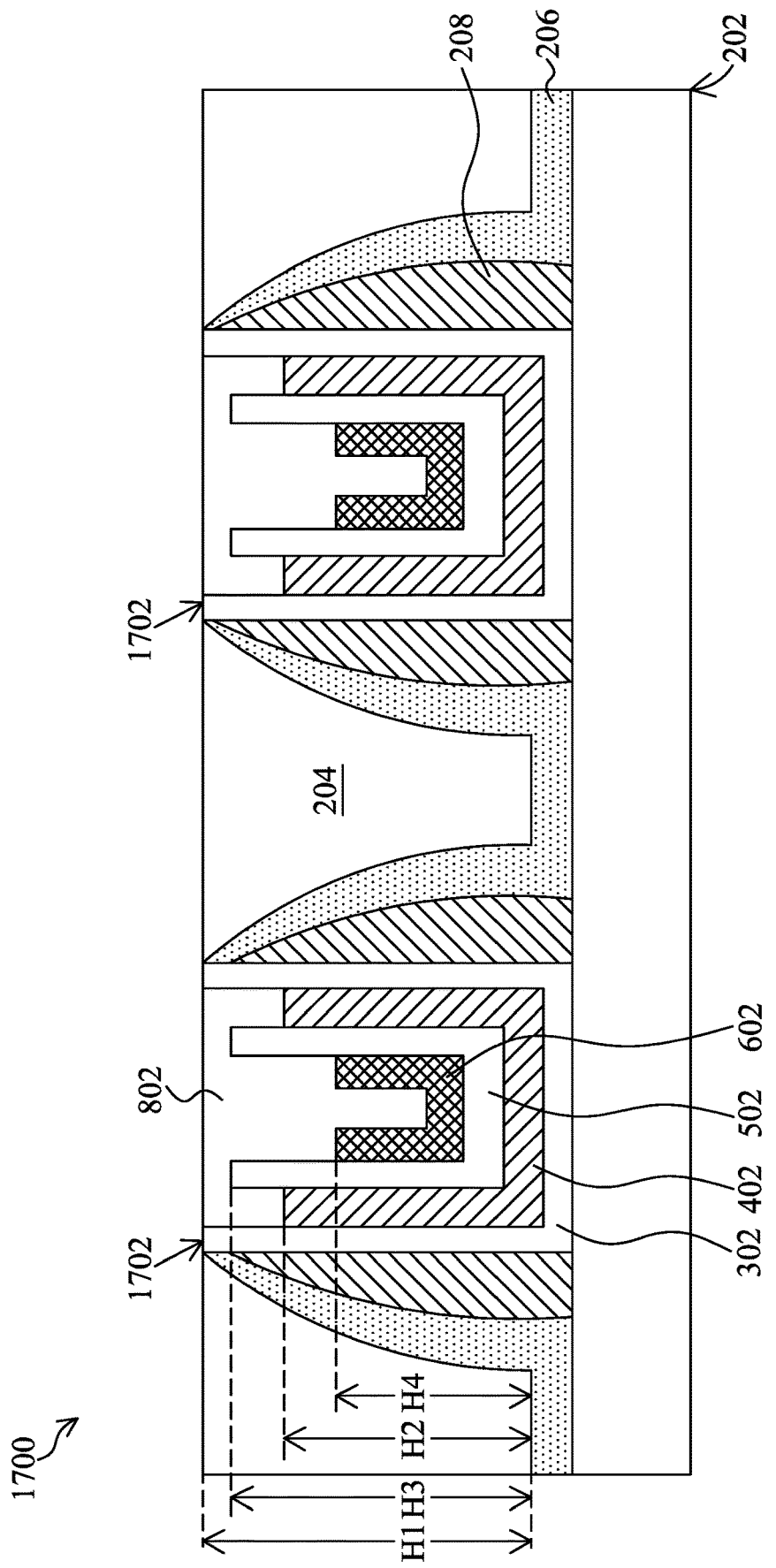

FIG. 17 illustrates a device 1700 having a gate structure 1702. The gate structure 1702 includes an IL 302, a dielectric layer 402, a barrier layer 502, a work function metal layer 602 and a fill metal layer 802. It is noted that other layers may also be included such as, for example, capping layers, additional barrier layers, and the like. Similarly, one or more layers may be omitted. One or more of the IL 302, the dielectric layer 402, the barrier layer 502, the work function metal layer 602 and the fill metal layer 802 may include a plurality of layers. The height of the gate structure 1702 is H1. H1 may be depth of the trench formed by the removal of the dummy gate structure. The height of the dielectric layer 402 is H2. The height of the barrier layer 502 is H3. The height of the work function metal layer 602 is H3. In the embodiment of the device 1700, H1>H3>H2>H4.

The differing heights of the layers of the gate structure 1702 may be provided by a single etching step (e.g., wet etch, dry etch, plasma etch, and/or other suitable etching process). For example, the differing etch rate of the materials based on the selectivity of the chosen etching process may provide for differing heights of the layers. In other embodiments, a plurality of etching steps may be performed. The differing heights of the layers of the gate structure 1702 may be provided by the profile modification process substantially similar to as discussed above with reference to block 114 of FIG. 1 and/or block 1016 of FIG. 10.

Figure 18:
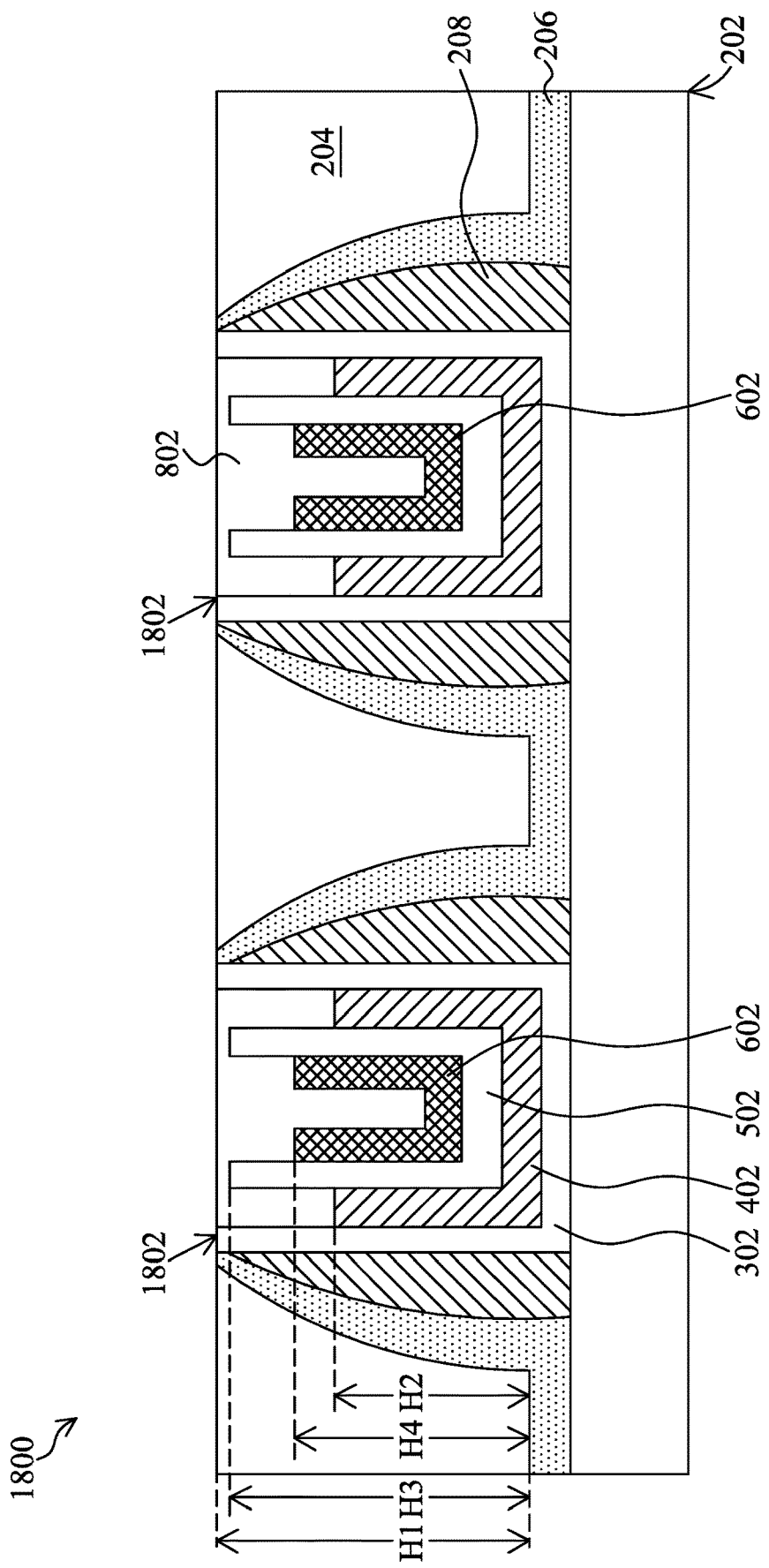

FIG. 18 illustrates a device 1800 having a gate structure 1802. The gate structure 1802 includes an IL 302, a dielectric layer 402, a barrier layer 502, a work function metal layer 602 and a fill metal layer 802. It is noted that other layers may also be included such as, for example, capping layers, additional barrier layers, and the like. Similarly, one or more layers may be omitted. One or more of the IL 302, the dielectric layer 402, the barrier layer 502, the work function metal layer 602 and the fill metal layer 802 may include a plurality of layers. The height of the gate structure 1802 is H1. H1 may be depth of the trench formed by the removal of the dummy gate structure. The height of the dielectric layer 402 is H2. The height of the barrier layer 502 is H3. The height of the work function metal layer 602 is H3. In the embodiment of the device 1800, H1>H3>H4>H2.

The differing heights of the layers of the gate structure 1802 may be provided by a single etching step (e.g., wet etch, dry etch, plasma etch, and/or other suitable etching process). For example, the differing etch rate of the materials based on the selectivity of the chosen etching process may provide for differing heights of the layers. In other embodiments, a plurality of etching steps may be performed. The differing heights of the layers of the gate structure 1802 may be provided by the profile modification process substantially similar to as discussed above with reference to block 114 of FIG. 1 and/or block 1016 of FIG. 10.

Figure 19:
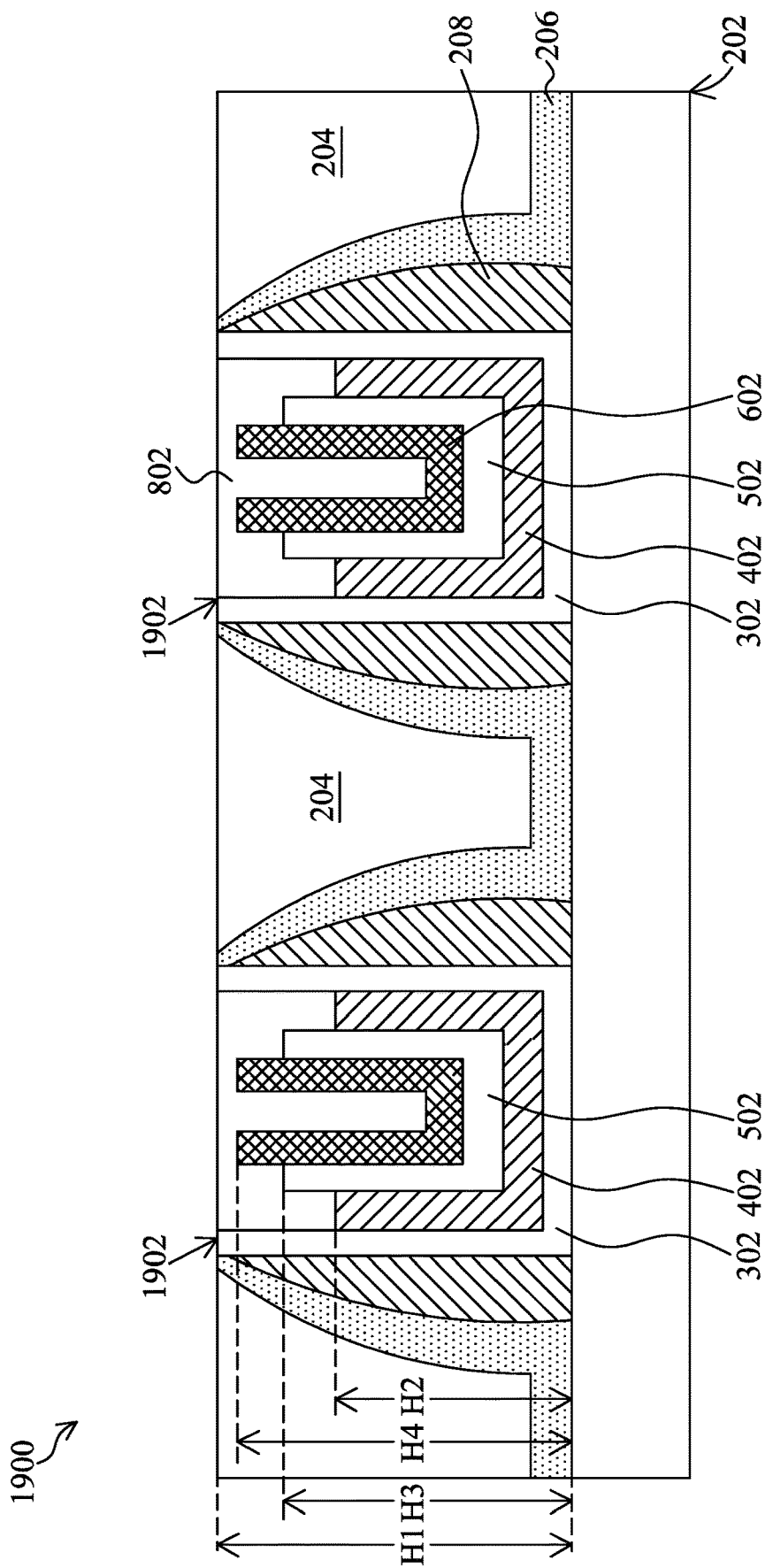

FIG. 19 illustrates a device 1900 having a gate structure 1902. The gate structure 1902 includes an IL 302, a dielectric layer 402, a barrier layer 502, a work function metal layer 602 and a fill metal layer 802. It is noted that other layers may also be included such as, for example, capping layers, additional barrier layers, and the like. Similarly, one or more layers may be omitted. One or more of the IL 302, the dielectric layer 402, the barrier layer 502, the work function metal layer 602 and the fill metal layer 802 may include a plurality of layers. The height of the gate structure 1902 is H1. H1 may be depth of the trench formed by the removal of the dummy gate structure. The height of the dielectric layer 402 is H2. The height of the barrier layer 502 is H3. The height of the work function metal layer 602 is H3. In the embodiment of the device 1900, H1>H4>H3>H2.

The differing heights of the layers of the gate structure 1902 may be provided by a single etching step (e.g., wet etch, dry etch, plasma etch, and/or other suitable etching process). For example, the differing etch rate of the materials based on the selectivity of the chosen etching process may provide for differing heights of the layers. In other embodiments, a plurality of etching steps may be performed. The differing heights of the layers of the gate structure 1902 may be provided by the profile modification process substantially similar to as discussed above with reference to block 114 of FIG. 1 and/or block 1016 of FIG. 10.

Figure 20:
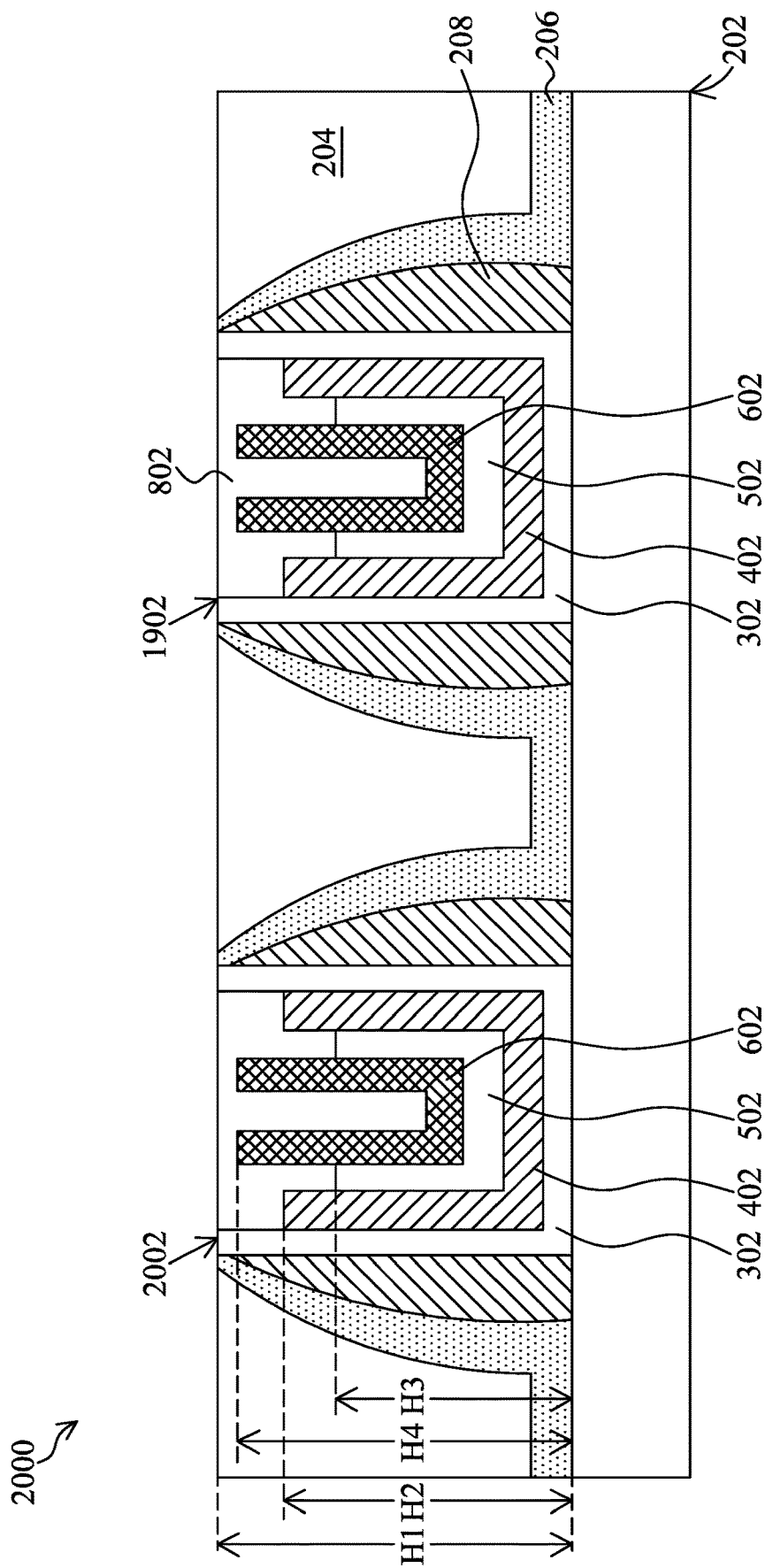

FIG. 20 illustrates a device 2000 having a gate structure 2002. The gate structure 2002 includes an IL 302, a dielectric layer 402, a barrier layer 502, a work function metal layer 602 and a fill metal layer 802. It is noted that other layers may also be included such as, for example, capping layers, additional barrier layers, and the like. Similarly, one or more layers may be omitted. One or more of the IL 302, the dielectric layer 402, the barrier layer 502, the work function metal layer 602 and the fill metal layer 802 may include a plurality of layers. The height of the gate structure 2002 is H1. H1 may be depth of the trench formed by the removal of the dummy gate structure. The height of the dielectric layer 402 is H2. The height of the barrier layer 502 is H3. The height of the work function metal layer 602 is H3. In the embodiment of the device 2000, H1>H4>H2>H3.

The differing heights of the layers of the gate structure 2002 may be provided by a single etching step (e.g., wet etch, dry etch, plasma etch, and/or other suitable etching process). For example, the differing etch rate of the materials based on the selectivity of the chosen etching process may provide for differing heights of the layers. In other embodiments, a plurality of etching steps may be performed. The differing heights of the layers of the gate structure 2002 may be provided by the profile modification process substantially similar to as discussed above with reference to block 114 of FIG. 1 and/or block 1016 of FIG. 10.

In summary, the methods and devices disclosed herein provide for a modified profile gate structure, for example, having one or more layer of the gate stack re-shaped (e.g., decreased in height. In doing so, embodiments of the present disclosure may offer advantages over prior art devices. Advantages of the present disclosure include improved gap filling of the trench in a replacement gate or gate-last process. It is understood that different embodiments disclosed herein offer different disclosure, and that they may make various changes, substitutions and alterations herein without departing from the spirit and scope of the present disclosure. As but one example, various illustrations provided herein may show a planar transistor. However, one of ordinary skill in the art would recognize the present disclosure also applies to fin-type field effect transistor devices (finFET), for example, where the gate structure is also provided by a replacement gate or gate-last process.

Thus, in an embodiment, described is a method of providing a semiconductor substrate having a trench disposed thereon. A plurality of layers is formed in the trench. The plurality of layers formed in the trench is etched, which provides at least one etched layer having a top surface that lies below a top surface of the trench. In other words, the height of the etched layer in the trench is less than that of the trench.

In an embodiment, the etching to form the etched layer includes a dry etch process selected from the group consisting of inductively coupled plasma (ICP), transformer coupled plasma (TCP), electron cyclotron resonance (ECR), and reactive ion etch (RIE) and combinations thereof.

In an embodiment, the plurality of layers in the trench includes a gate dielectric layer and a work function metal layer. In a further embodiment, the etching provides a height of the work function layer disposed in the trench that is less than a height of the gate dielectric layer disposed in the trench. In another embodiment, the plurality of layers includes a gate dielectric layer and a work function layer and the etching process etches at least one of the gate dielectric layer and the work function layer. In an embodiment, the etching process provides a gate dielectric layer having a first height in the trench and the work function layer having a second height in the trench, wherein the second height is less than the first height and wherein the first height is defined by the top surface that lies below the top surface of the trench.

In an embodiment, after the etching, a fill metal layer is formed in the trench on the etched layer(s). The etching that layers may include providing a substantially V-shaped profile opening in the plurality of layers.

In another of the methods described herein, a method includes providing a substrate having a dummy gate structure disposed thereon. The dummy gate structure is removed to form a trench. A gate dielectric layer on the substrate and in the trench and a work function metal layer is formed on the gate dielectric layer in the trench. The profile of the gate dielectric layer and the work function metal layer are modified to provide a substantially v-shaped profile opening on the trench. The substantially v-shaped profile opening is then filled with a fill metal.

In a further embodiment, the work function metal layer is planarized prior to modifying the profile of the work function metal layer. In an embodiment, the method further includes performing a planarization process after filling the substantially v-shaped profile opening to form a metal gate structure in the trench. The metal gate structure includes the gate dielectric layer and the work function metal layer.

In an embodiment, the method also includes forming a barrier layer on the gate dielectric layer and underlying the work function metal layer. The profile of the barrier layer may also be modified concurrently with the modifying the profile of the gate dielectric layer and the work function metal layer.

Modifying the profile includes at least one process of: inductively coupled plasma (ICP), transformer coupled plasma (TCP), electron cyclotron resonance (ECR), and reactive ion etch (RIE).

Also described herein is a semiconductor device having a semiconductor substrate with a dielectric layer disposed thereon. A trench is defined in the dielectric layer. A metal gate structure is disposed in the trench. The metal gate structure includes a first layer and a second layer disposed on the first layer. The first layer extends to a first height in the trench and the second layer extends to a second height in the trench; the second height is less than the first height.

In an embodiment of the device, the first layer is a gate dielectric layer and the second layer is a metal work function layer. In an embodiment, the metal gate structure further includes a third layer disposed on the second layer. The third layer extends to a third height less than the second height. In a further embodiment, the third layer is a work function metal layer, the second layer is a barrier layer and the first layer is a gate dielectric layer. In an embodiment of the device, the metal gate structure further includes a fill metal layer. The fill metal layer has an interface with the first layer and the second layer.

What is claimed is:

1. A semiconductor device, comprising:
   a semiconductor substrate having a top surface; and
   a gate structure disposed over the semiconductor substrate, wherein the gate structure includes:

a gate dielectric layer of a substantially U-shaped configuration and extending to a first height above the top surface, wherein the substantially U-shaped configuration has a bottom portion, a first side portion extending up from a first end of the bottom portion and a second side portion extending up from a second end of the bottom portion;

a first metal layer directly on the gate dielectric layer, wherein the first metal layer interfaces a top surface of the bottom portion, a first portion of a sidewall of the first side portion, and a second portion of a sidewall of the second side portion; and a second metal layer over the first metal layer and extending to a second height above the top surface, wherein the second height is greater than the first height, and wherein the second metal layer interfaces a top surface of the first side portion and a top surface of the second side portion of the gate dielectric layer.

2. The semiconductor device of claim 1, wherein the first metal layer has a U-shaped configuration.

3. The semiconductor device of claim 1, wherein the first metal layer extends to a third height above the top surface, the third height less than the first height.

4. The semiconductor device of claim 1, further comprising: a dielectric layer abutting another sidewall of the first side portion of the gate dielectric layer.

5. The semiconductor device of claim 4, wherein the dielectric layer abuts a sidewall of the second metal layer.

6. The semiconductor device of claim 5, wherein the dielectric layer abuts the sidewall of the second metal layer above the another sidewall of the first side portion of the gate dielectric layer.

7. The semiconductor device of claim 4, wherein the dielectric layer extends to a third height above the top surface, wherein the third height is greater than the first height.

8. The semiconductor device of claim 1, wherein the second metal layer interfaces a top surface of the first side portion and a top surface of the second side portion of the first metal layer.

9. The semiconductor device of claim 1, wherein the second metal layer interfaces a second portion of a sidewall of the first side portion, and a second portion of a sidewall of the second side portion of the gate dielectric layer.

10. A semiconductor device comprising:
a gate structure disposed on a semiconductor substrate, the gate structure having:
a gate dielectric layer having a bottom portion and two side portions extending vertically above the bottom portion of the gate dielectric layer;
a first metal layer directly on the gate dielectric layer and having a bottom portion and two side portions extending vertically above the bottom portion of the first metal layer;
a second metal layer directly on the first metal layer and including a bottom portion and two side portions extending vertically above the bottom portion of the second metal layer; and
a third metal layer directly on the second metal layer and interfacing a top surface of the two side portions of the gate dielectric layer.

11. The device of claim 10, wherein the first metal layer has a U-shaped configuration.

12. The device of claim 10, wherein the two side portions of the gate dielectric layer extend vertically to a first height above the top surface of the semiconductor substrate and the two side portions of the first metal layer extend to a second height above the top surface of the semiconductor substrate, wherein the second height is less than the first height.

13. The device of claim 12, wherein the third metal layer extends to a third height above the top surface of the semiconductor substrate, the third height being greater than the first height.

14. The device of claim 10, further comprising:
another dielectric layer abutting the two side portions of the gate dielectric layer.

15. The device of claim 14, wherein the third metal layer abuts the another dielectric layer.

16. The device of claim 10, wherein the third metal layer directly interfaces a top surface of the bottom portion of the second metal layer and top surfaces of each of the two side portions of the second metal layer.

17. A semiconductor device comprising:
a gate structure disposed on a semiconductor substrate, the gate structure having:
a gate dielectric layer having a U-shaped configuration, wherein the gate dielectric layer has an upper most surface at a first height from a top surface of the semiconductor substrate;
a first metal-containing layer directly on the gate dielectric layer, wherein the first metal-containing layer has an uppermost surface at a second height from the top surface of the semiconductor substrate, wherein the second height is less than the first height; and
a second metal-containing layer over the first metal-containing layer; and
a dielectric layer abutting the gate dielectric layer and the second metal-containing layer, wherein the dielectric layer has a different composition than the gate dielectric layer.

18. The device of claim 17, wherein the dielectric layer is silicon oxide layer ($SiO_2$) or silicon oxynitride (SiON).

19. The device of claim 17, wherein the dielectric layer extends to a third height greater than the first height.

20. The device of claim 17, further comprising: a spacer element adjacent the dielectric layer.

* * * * *